FORWARD AND DELAYED REVERSE AUTOMATIC GAIN CONTROL CIRCUIT

Filed May 22, 1967

INVENTOR
Per T Overlie

BY Hofgren, Wegner, Allen, Stellman & McCord
ATTORNEYS

United States Patent Office 3,546,591

Patented Dec. 8, 1970

3,546,591

FORWARD AND DELAYED REVERSE AUTOMATIC GAIN CONTROL CIRCUIT

Per T. Overlie, Chicago, Ill., assignor to Warwick Electronics Inc., a corporation of Delaware Filed May 22, 1967, Ser. No. 639,978
Int. Cl. H03f *1/34*; H04b *1/24*
U.S. Cl. 325—319 4 Claims

ABSTRACT OF THE DISCLOSURE

An AGC circuit for an FM receiver provides fixed AGC bias for no received signal, forward AGC bias to the RF stage for intermediate strength signals, and both forward AGC bias to the RF stage and reverse AGC bias to the IF stage for strong signals. The forward AGC bias is generated from the received signal, while the reverse AGC bias is generated in proportion to the forward AGC bias.

Figures 1, 2:
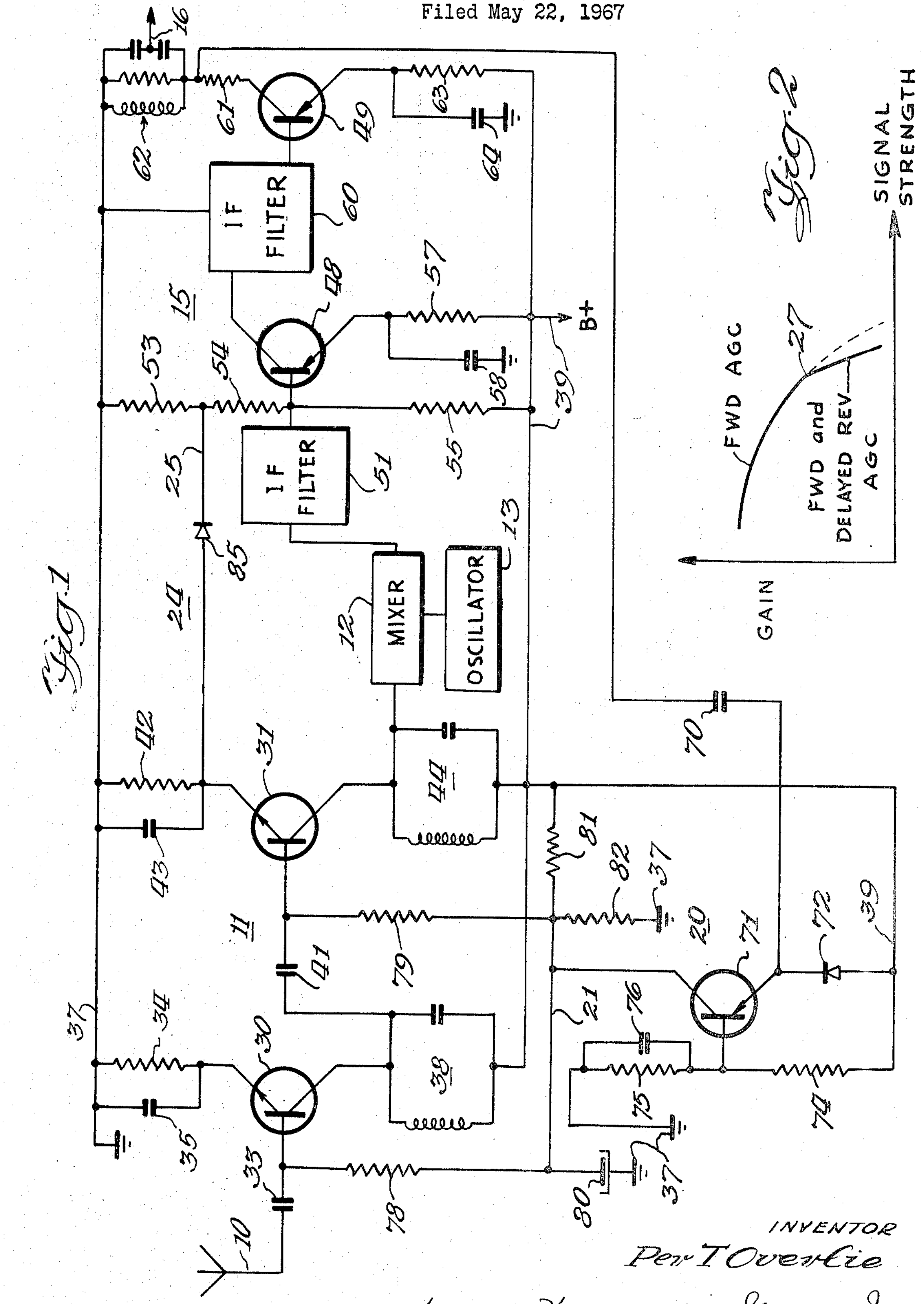

This invention relates to an automatic gain control circuit for a radio receiver.

An automatic gain control (AGC) circuit for a receiver should be capable of compensating for a wide range of varying strength signals. Prior AGC circuits have not provided satisfactory sensitivity for weak and medium strength signals while also being able to handle overload problems created by strong signals. In order to achieve sensitivity, it has often been necessary to use a "local-distance" switch which may be manually operated for the signal being received. Otherwise, a compromise in the design of the AGC circuit has been necessary to prevent strong signals from deteriorating the selectivity of the receiver.

One object of this invention is to provide an improved AGC circuit.

Another object of this invention is to provide an AGC circuit capable of compensating for a wide range of input signal strengths.

One feature of this invention is an improved AGC circuit, for an FM receiver, employing forward gain control for one portion and reverse gain control for another portion of cascaded amplifying stages.

Another feature of the invention is to provide an improved AGC circuit which allows the elimination of "local-distance" switches in a receiver without compromising the sensitivity of the receiver for varying signal levels.

Yet another feature of the invention is the provision of an AGC circuit especially adapted to control the gain of transistorized amplifying stages.

Still a further feature of this invention is the provision of an AGC circuit employing a transistorized DC amplifier for developing at least one of a plurality of gain control signals for use in the same receiver.

Further features and advantages of the invention will be apparent from the following specification and from the drawings, in which:

FIG. 1 is a partly block and partly schematic diagram of one embodiment of the invention for an FM receiver; and FIG. 2 is a diagram of the gain characteristics of cascaded amplifying stages under control of the AGC signals developed by the AGC circuit of FIG. 1.

While an illustrative embodiment of the invention is shown in the drawings and will be described in detail herein, the invention is susceptible of embodiment in several different forms and it should be understood that the present disclosure is to be considered as an exemplification of the principles of the invention and is not intended to limit the invention to the embodiment illustrated. Throughout the description of the circuit, values and type designations will be given for certain of the components in order to disclose a complete, operative embodiment of the invention. However, these values and type designations are merely illustrative and are not critical unless specifically so stated.

Turning generally to FIG. 1, an embodiment of the AGC circuit is illustrated in connection with a transistorized FM receiver. The receiver has an antenna 10 coupled to a radio frequency (RF) amplifying section 11. The amplified signals are connected to a mixer 12 and oscillator 13 of conventional design to produce an intermediate frequency (IF) signal. The IF signal is coupled to an IF amplifying section 15 which has an output at 16 for connection to other circuits of the receiver. These circuits may include additional stages of IF amplification, a detector for recovering the intelligence contained in the radio signal, and audio-amplifying stages.

In accordance with the invention, a "forward" AGC circuit 20 develops a forward biasing AGC signal at a line or bus 21 for controlling the gain of one of the transistorized amplifying sections. Forward AGC drives a transistor towards saturation, biasing the operating point of the transistor along a flatter top portion of its transfer curve. This decreases the gain of the transistor stage, and has the further advantage of collapsing the emitter-collector DC potential of the transistor, clipping the input FM signal. Thus, forward AGC varies gain inversely as a function of the amplitude of received signals, and has the advantage of aiding the limiting action of the FM receiver.

In addition to the forward AGC circuit, a "reverse" AGC circuit 24 develops a reverse biasing AGC signal at a line or bus 25 for controlling the gain of the other transistorized amplifying section. Reverse AGC drives a transistor towards cut-off, biasing the operating point of the transistor along a flatter bottom portion of its transfer curve, and thus controlling gain inversely as a function of the amplitude of received signals, producing a similar gain effect as forward AGC.

A network, to be discussed in detail hereafter, causes the reverse AGC circuit 24 to develop its output signal in response to the forward AGC signal developed by the forward AGC circuit 20. Furthermore, the reverse AGC signal is not applied to the IF stage until the forward AGC on line 21 reaches a predetermined amplitude, thereby switching the receiver from a "distant" to a "local" mode of reception.

For FM receivers, it is desirable that the IF stage be operated at maximum gain, while the gain of the RF stage be controlled for AGC purposes. Accordingly, the forward AGC circuit 20 controls the RF amplifying section 11, for control over intermediate strength signals. The reverse AGC circuit 24 controls the IF section 15, reducing the gain of the IF section only when a strong input signal could oversaturate the IF stage, thereby automatically switching to a local mode of reception. During normal signal strengths, that is, signals which would not oversaturate the receiver, the IF stage is maintained at a constant gain while only the gain of the RF stage is controlled.

The effect of the dual AGC circuits on the gain of the amplifying stages of the FM receiver can be seen in FIG. 2, where overall gain is plotted as a function of input signal strength. For no signal input, or signals of small signal strength, the overall gain of the cascaded amplifying stages remains constant. For intermediate strength signals, the overall gain of the amplifying stages decreases for increasing strength signals due to the action of the forward (FWD) AGC signal. When the signal strength exceeds a point 27, at which an overload condition could occur, the reverse (REV) AGC signal further reduces the overall gain of the amplifying stages from that which would occur solely by operation of the forward AGC signal alone, as indicated by the dashed lines, thereby producing the composite gain effect as shown by the solid line.

Turning in detail to FIG. 1, RF section 11 of the FM receiver comprises a pair of semiconductor devices, in the form of NPN transistors 30 and 31, type 2N918, connected in cascade. A 5.6 micromicrofarad capacitor 33 couples antenna 10 to the base of transistor 30. The emitter of transistor 30 is connected through a paralleled one kilohm resistor 34 and a 0.001 microfarad capacitor 35 to a source of reference or ground potential 37, as zero volts. The time constant of RC network 34, 35 is chosen to be sufficiently long to not follow the radio frequency input signal from antenna 10, which typically may vary from 88 to 108 megacycles. The collector of transistor 30 is coupled through an RF tuning circuit 38 to a source 39, of positive DC potential or B+, as 12 volts.

The collector of transistor 30 is also coupled through another 5.6 micromicrofarad capacitor 41 to the base of the second transistor 31. The emitter of transistor 31 is coupled through an RC network 42, 43 to ground 37, and the collector of the transistor is coupled through an RF tuning circuit 44 to B+, in a manner similar to the corresponding parts for transistor 30. The output appears at the collector of transistor 31 and is coupled to mixer 12. Filters 38, 44 may be formed from variable inductors and capacitors which may be ganged to oscillator 13, to tune the receiver through a range of frequencies.

IF amplifier 15 consists of two semiconductor devices, PNP transistors 48 and 49, type TI403. The first transistor 48 in IF section 15 is chosen to be complementary, i.e., of opposite conductivity type, to the transistors in the RF section 11, for reasons which will appear hereinafter. The base of transistor 48 is coupled through an IF filter 51 to the output of mixer 12. An 18 kilohm resistor 53, a 10 kilohm resistor 54, and a 39 kilohm resistor 55 are connected in series across ground 37 and B+. The junction of resistors 54 and 55 is connected to the base of transistor 48 for biasing the transistor to the proper operating point. For this purpose, the total resistance value of resistors 53 and 54 is chosen, relative to the value of resistor 55, to produce the proper back bias on transistor 48. The emitter of transistor 48 is connected to B+ through a 1.8 kilohm resistor 57 and is by-passed to ground 37 by a 0.1 microfarad capacitor 58.

The collector of transistor 48 is connected through a second IF filter 60 to the base of transistor 49. The collector of transistor 49 is in turn coupled through a 220 ohm resistor 61 to a third IF filter 62, and thence through output line 16 to the remaining stages of the FM receiver. The emitter of transistor 49 is connected to B+ through a 1.0 kilohm resistor 63 and is bypassed to ground 37 by a 0.1 microfarad capacitor 64. IF filters 51, 60, and 62 are of suitable design having a resonant frequency equal to the intermediate frequency output from mixer 12, which in turn corresponds to the difference between the received signal frequency and the frequency of oscillator 13. Typically, the IF filters will have a resonant frequency of 10.7 megacycles.

The FM receiver described above is of conventional design, it being noted however, that certain of the elements previously described also interact in a unique manner with the dual AGC circuit described hereafter. More particularly, the AGC detector is preferably coupled to the last IF stage, improving the desensitization problem existing in prior systems because the AGC detector benefits from the total skirt selectivity of the receiver. As a result, the AGC circuit is not adversely affected by a strong unwanted input FM signal adjacent a weak input FM signal. In addition, the IF filters 51, 60, and 62 are designed to have high input and low output impedances, so that the filters are less sensitive to transistor parameter changes due to AGC action.

Considering now the AGC circuit in more detail, a 15 micromicrofarad capacitor 70 connects load resistor 61 of transistor 49 to the emitter electrode of a type 2N1274 PNP transistor 71 in AGC circuit 20. The emitter of transistor 71 is also connected through a 1N295 diode 72 to B+. The base of transistor 71 is connected to the junction of a 220 ohm resistor 74 and a 68 kilohm resistor 75 connected between B+ and ground 37 to form a voltage divider for back biasing transistor 71. Resistor 75 is shunted by a 0.1 microfarad capacitor 76.

The forward AGC voltage is developed at the collector of transistor 71, which in turn is connected directly to line 21 and through 1.0 kilohm resistors 78, 79 to the bases of transistors 30 and 31 in RF section 11. A 25 microfarad capacitor 80 is connected between line 21 and ground 37 for smoothing out the AGC voltage developed by transistor 71. In addition, line 21 is also connected to the junction of a 100 kilohm resistor 81 and a 22 kilohm resistor 82 connected in series between B+ and ground 37. Resistors 81, 82 form a voltage divider which develops a fixed value DC voltage on line 21, for purposes which will be apparent hereinafter.

Reverse AGC circuit 24 includes a semiconductor diode 85, type 1N295, whose anode is connected to the emitter of transistor 31 in RF stage 11, and whose cathode is connected directly to line 25 and to the junction of resistors 53, 54 in IF stage 15. Since the conduction of transistor 31 is controlled by the forward AGC voltage through resistor 79, the voltage drop across emitter resistor 42 is proportional to the value of forward AGC voltage on line 21. This voltage drop is used as the input to the reverse AGC circuit 24.

The operation of the dual AGC circuit is as follows. When no signal is received by antenna 10, there is no signal to transistor 71 and diode 72 in the forward AGC circuit 20. The voltage at the base of transistor 71, from voltage divider 74, 75 back biases the transistor and drives it into its cut-off mode. In this situation, the voltage at 21 is fixed by voltage divider resistors 81 and 82. This constant voltage is coupled through resistors 78 and 79 to the bases of the transistors 30, 31 in the RF amplifier 11, biasing their emitter-base junctions to an operating point having a maximum gain.

The "no signal" voltage at 25 is established by proper choice of the value of resistors 53, 54, 55 to be more positive than the voltages at the emitter of transistor 31 during the time transistor 71 is driven into cut-off. Because the voltage on line 25 back-biases diode 85, the biasing voltages on the base of transistor 48 is constant, being determined solely by the ratio of the value of resistor 55 with the total value of resistors 53 and 54. Thus, during the time no signal is received, the AGC circuit maintains fixed value bias voltages on the variable gain amplifiers in the receiver. This represents an optimum no-signal condition, since changing noise levels and the like do not affect the overall amplification of the receiver.

For a low level signal which would not cause an overload or blocking condition, only a varying forward bias signal on bus 21 is developed. More particularly, capacitor 70 couples a small amount of 10.7 megacycle IF signal to the cathode of diode 72 and to the emitter of transistor 71. The positive half cycles of the IF signal is rectified by diode 72, causing current to flow in the diode and therefore in the emitter of transistor 71. The values of resistors 74 and 75 are chosen so that the emitter-base junction of transistor 71 is forward biased when the IF signal is received. During this time, transistor 71 acts as a DC amplifier, with stronger IF signals driving the transistor towards its saturation mode. A current flows through resistor 82 causing an increased positive potential on bus 21.

This increased positive voltage forward biases transistors 31 and 30 along a steeper portion of their transfer curves, causing the overall amplification of RF section 11 to decrease in proportion to the strength of RF signals at antenna 10. However, the current flowing through the emitter of transistor 31 is not sufficient at this time to cause a voltage drop which will forward bias diode 85. Therefore, no reverse bias AGC signal is applied to transistor 48, and the gain of the IF section 15 remains constant.

For an RF signal which would normally cause an overload or blocking condition at the receiver, both the forward AGC circuit 20 and the reverse AGC circuit 24 are activated to control the overall gain of the RF and IF sections of the receiver. The forward AGC circuit 20 continues to operate in a manner as previously described. In addition, the increased positive voltage on line 21 now sufficiently forward biases transistor 31 to cause the voltage drop across resistor 42 to exceed the voltage drop across resistor 53, thus forward biasing diode 85. This switches the diode into its conducting mode, causing a current to flow through diode 85 in a direction which back biases the first transistor 48 in IF amplifier 15. The reverse AGC potential coupled to the base of transistor 48 from diode 85 follows the potential of the emitter of transistor 31. Thus, the reverse AGC voltage, which is developed in response to the forward AGC voltage, is delayed in order to produce optimum gain for the receiver at all times.

Because transistor 48 is complementary to transistor 31, a simple single diode circuit is sufficient to back bias the IF transistor and provide reverse AGC action. If the transistors 31 and 48 were of the same type, an additional inverter stage would be necessary to produce the same result. Reverse AGC bias at line 25 could be connected to other transistors in IF stage 15 if so desired.

The reverse AGC voltage decreases the overall gain of IF amplifier 15, when diode 85 is switched to its conducting mode. This automatic switching action prevents an overload condition which would otherwise occur, without the use of a manual switch or other device as is often used in conventional receivers. Thus, the dual AGC circuit compensates for both close and distant stations, and provides a fixed gain for a no signal condition. Of course, the pair of AGC signals derived by the dual AGC circuit may, if desired, be used in other portions of the FM receiver to control the gain of other amplifying stages.

I claim:

1. In a radio receiver having an RF amplifying stage including a first variable gain amplifier, an IF amplifying stage including a second variable gain amplifier, an automatic gain control circuit comprising:
- means for producing a control potential proportional to the received signal amplitude;
- first means for deriving a first gain control signal from said control potential;
- first coupling means coupling said first gain control signal to said first variable gain amplifier to effect forward gain control thereof;
- second means for deriving a second gain control signal proportional to said first gain control signal; and
- second coupling means for coupling said second gain control signal to said second variable gain amplifier to effect reverse gain control thereof, said second coupling means including means to prevent application of said second gain control signal to said second variable gain amplifier when said second gain control signal is below a predetermined level.

2. In a radio receiver having first and second cascade connected variable gain amplifiers, an automatic gain control circuit comprising:
- a transistorized DC amplifier for producing a control potential proportional to the received signal amplitude, said DC amplifier having an input and an output, means coupling the received signal to said input and means for biasing said DC amplifier to cutoff in the absence of received signals;
- means coupled to the output of said DC amplifier for deriving a first gain control signal proportional to said control potential;
- first coupling means coupling said first gain control signal to one of said first and second variable gain amplifiers to effect forward gain control thereof;
- second means for deriving a second gain control signal proportional to said first gain control signal; and
- second coupling means for coupling said second gain control signal to the other of said first and second variable gain amplifiers to effect the reverse gain control thereof, said second coupling means including means to prevent application of said second gain control signal to said other variable gain amplifier when said second gain control signal is less than a predetermined level.

3. The apparatus of claim 2 wherein said means coupling said received signal to said input comprises a source of operating potential, a diode and a capacitor, said diode and capacitor being serially connected between said source of operation potential and said received signal and means connecting the junction between said diode and capacitor to said input.

4. In a radio receiver having cascade connected first and second variable gain amplifiers each including at least one semiconductor device, an automatic gain control circuit comprising:
- forward gain control means connected to one of said amplifiers for developing a forward automatic gain control signal which forward biases at least one semiconductor device in said one amplifier to control the gain thereof inversely as a function of the received signal strength, said forward gain control means developing a fixed value DC bias voltage in the absence of a received signal and a forward automatic gain control signal that increases the bias of said one variable gain amplifier as the received signal amplitude increases;
- reverse gain control means connected to the other of said variable gain amplifiers for controlling the gain thereof inversely as a function of the amplitude of received signals having a predetermined minimum amplitude, said reverse gain control means having means for generating a fixed bias voltage in the presence of received signals having an amplitude below said predetermined minimum level and a reverse automatic gain control signal that decreases the bias voltage of said other variable gain amplifier as said received signal amplitude increases above said predetermined minimum level;
- circuit means including said forward and reverse gain control means for developing said forward automatic gain control signals in response to the received signal strength and said reverse automatic gain control signal in response to said forward automatic gain control signal.

References Cited

UNITED STATES PATENTS

| | | | |
|---|---|---|---|
| 3,440,543 | 3/1969 | Polzl | 325—319 |
| 3,457,366 | 7/1969 | Kent et al. | 325—405 |
| 2,912,572 | 11/1959 | Wilhelmsen | 325—411 |
| 3,205,444 | 9/1965 | Birkenes | 325—405 |
| 3,310,752 | 3/1967 | Forsthuber et al. | 330—26 |
| 3,328,714 | 6/1967 | Hugenholtz | 325—319 |
| 3,341,780 | 9/1967 | Sethna | 325—405 |
| 3,344,355 | 9/1967 | Massman | 325—405 |

ROBERT L. GRIFFIN, Primary Examiner
JAMES A. BRODSKY, Assistant Examiner

U.S. Cl. X.R.

325—405, 411; 330—26